United States Patent
Wang et al.

(10) Patent No.: US 9,443,986 B2
(45) Date of Patent: Sep. 13, 2016

(54) THIN FILM TRANSISTOR

(71) Applicant: E Ink Holdings Inc., Hsinchu (TW)

(72) Inventors: Chih-Hsuan Wang, Hsinchu (TW);
Chia-Chun Yeh, Hsinchu (TW);
Ted-Hong Shinn, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 14/195,863

(22) Filed: Mar. 4, 2014

(65) Prior Publication Data

US 2015/0069379 A1    Mar. 12, 2015

(30) Foreign Application Priority Data

Sep. 9, 2013   (TW) ................. 102132467 A

(51) Int. Cl.
*H01L 29/10*      (2006.01)
*H01L 29/786*     (2006.01)
*H01L 29/26*      (2006.01)

(52) U.S. Cl.
CPC .......... *H01L 29/7869* (2013.01); *H01L 29/26* (2013.01)

(58) Field of Classification Search
CPC .............. H01L 27/1251; H01L 29/26; H01L 29/4908; H01L 29/7869
USPC ................... 438/149–167; 257/43, E29.151, 257/E51.005
See application file for complete search history.

(56) References Cited

U.S. PATENT DOCUMENTS

| | | | |
|---|---|---|---|
| 7,453,087 B2 | 11/2008 | Iwasaki | |
| 7,696,513 B2 | 4/2010 | Hayashi et al. | |
| 7,923,723 B2 | 4/2011 | Hayashi et al. | |
| 7,964,871 B2 | 6/2011 | Iwasaki | |
| 8,299,461 B2 | 10/2012 | Tanaka et al. | |
| 8,343,800 B2 | 1/2013 | Umeda et al. | |
| 8,378,344 B2 | 2/2013 | Sakakura et al. | |
| 2007/0194379 A1 | 8/2007 | Hosono et al. | |
| 2012/0074399 A1* | 3/2012 | Den Boer ......... H01L 29/78603 257/43 |
| 2012/0091452 A1 | 4/2012 | Ohta et al. | |
| 2012/0138920 A1* | 6/2012 | Khang et al. .................. 257/43 |
| 2013/0009111 A1 | 1/2013 | Morita et al. | |

FOREIGN PATENT DOCUMENTS

EP        2284293 A1 *  2/2011  .......... C04B 35/453
JP        2009099944 A    5/2009

OTHER PUBLICATIONS

Corresponding Taiwanese Office Action that these art references were cited.

* cited by examiner

*Primary Examiner* — Brook Kebede
(74) *Attorney, Agent, or Firm* — CKC & Partners Co., Ltd.

(57) ABSTRACT

A thin file transistor includes a gate electrode, a source electrode, a drain electrode, a gate-insulating layer, and an oxide semiconductor layer. The oxide semiconductor layer includes indium-gallium-zinc oxide with a formula of $In_xGa_yZn_zO_w$, in which x, y and z satisfy the following formulas $1.5 \leq (y/x) \leq 2$ and $1.5 \leq (y/z) \leq 2$. The gate-insulating layer is positioned between the gate electrode and the oxide semiconductor layer. The source electrode and the drain electrode are respectively connected to two different sides of the oxide semiconductor layer.

13 Claims, 6 Drawing Sheets

THIN FILM TRANSISTOR

PRIORITY CLAIM AND CROSS-REFERENCE

This application claims priority to Taiwanese Application Serial Number 102132467, filed Sep. 9, 2013, which is herein incorporated by reference.

BACKGROUND

1. Technical Field

The present disclosure relates to a thin film transistor. More particularly, the present disclosure relates to a thin film transistor having a layer of indium gallium zinc oxide semiconductor.

2. Description of Related Art

Metal oxide semiconductor thin film transistors (TFTs) utilize metal oxide to serve as semiconductor layers. As compared to amorphous silicon TFTs, metal oxide semiconductor TFTs possess a higher mobility, and therefore metal oxide semiconductor TFTs exhibit a better electrical performance. In addition, the method of manufacturing metal oxide semiconductor TFTs is simpler than that of low temperature polycrystalline silicon TFTs, so that metal oxide semiconductor TFTs has a higher productivity. However, the electrical characteristics of conventional metal oxide semiconductor TFTs are unstable and unreliable. For instance, the threshold voltage of metal oxide semiconductor TFTs usually varies and shifts unexpectedly, and the concern about unreliability limits the application of metal oxide semiconductor TFTs. Accordingly, there exists in this art a need for an improved metal oxide semiconductor TFT which would enhance the reliability thereof.

SUMMARY

According to one aspect of the present disclosure, a thin film transistor is provided, in which the reliability of the thin film transistor is improved. According to various embodiments of the present disclosure, the mobility of the thin film transistor is greater than 10 cm²/Vs, the variations in threshold voltage are less than about 1.3 V, and the subthreshold swing is less than about 0.6 V/dec. The thin film transistor includes a gate electrode, a gate insulating layer, a source electrode, a drain electrode and an oxide semiconductor layer. The oxide semiconductor layer includes indium gallium zinc oxide represented by a general formula of $In_xGa_yZn_zO_w$, in which x, y, z and w respectively represent atomic ratios of indium, gallium, zinc and oxygen, and x, y and z satisfy the requirements of the following formulae: $1.5 \leq (y/x) \leq 2$ and $1.5 \leq (y/z) \leq 2$. The gate insulating layer is positioned between the gate electrode and the oxide semiconductor layer. The source electrode and the drain electrode are respectively connected to different sides of the oxide semiconductor layer.

According to some embodiments of the present disclosure, x and z satisfy the following formula: $0.9 \leq (x/z) \leq 1.1$.

According to some embodiments of the present disclosure, y and w satisfy the following formula: $0.375 \leq (y/w) \leq 0.5$.

According to some embodiments of the present disclosure, when (x+y+z) is defined as 1, x satisfies the following formula: $0.375 \leq (y/w) \leq 0.5$.

According to some embodiments of the present disclosure, when (x+y+z) is defined as 1, y satisfies the following formula: $0.42 \leq y \leq 0.5$.

According to some embodiments of the present disclosure, when (x+y+z) is defined as 1, z satisfies the following formula: $0.25 \leq z \leq 0.3$.

According to some embodiments of the present disclosure, when (x+y+z+w) is defined as 1, x satisfies the following formula: $0.125 \leq x \leq 0.134$.

According to some embodiments of the present disclosure, when (x+y+z+w) is defined as 1, y satisfies the following formula: $0.2 \leq y \leq 0.25$.

According to some embodiments of the present disclosure, when (x+y+z+w) is defined as 1, z satisfies the following formula: $0.125 \leq z \leq 0.134$.

According to some embodiments of the present disclosure, when (x+y+z+w) is defined as 1, w satisfies the following formula: $0.5 \leq w \leq 0.54$.

According to various embodiments of the present disclosure, a thin film transistor includes a gate electrode, a gate insulating layer, an oxide semiconductor layer, a source electrode and a drain electrode. The thin film transistor is characterized in that the oxide semiconductor layer includes indium gallium zinc oxide represented by a general formula of $In_xGa_yZn_zO_w$, in which x, y, z and w respectively represent atomic ratios of indium, gallium, zinc and oxygen, and x, y and z satisfy the requirements of the following formulae: $0.25 \leq x/(x+y+z) \leq 0.42 \leq y/(x+y+z) \leq 0.5$; and $0.25 \leq z/(x+y+z) \leq 0.3$.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
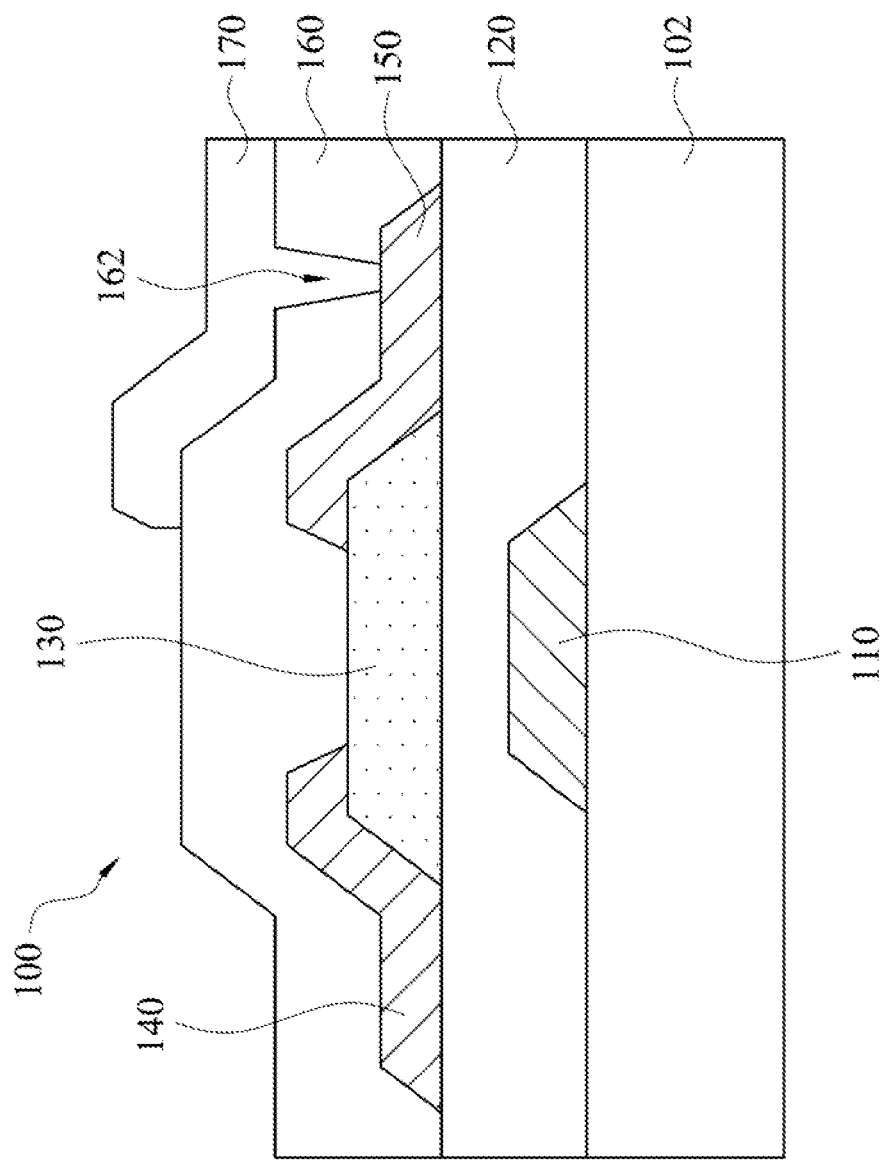
FIG. 1 is a cross-sectional view schematically illustrating a thin film transistor according to various embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

FIG. 1 is a cross-sectional view schematically illustrating, a thin film transistor 100 according to various embodiments of the present disclosure. The thin film transistor 100 includes a gate electrode 110, a gate insulating layer 120, an oxide semiconductor layer 130, a source electrode 140 and a drain electrode 150.

The gate electrode 110 is disposed on a substrate 102 such as for example a glass substrate or a silicon substrate. The gate electrode 110 may be formed by conventional approaches such as sputtering, pulsed laser deposition, electron beam physical vapor deposition, chemical vapor deposition or other suitable methods. The gate electrode 110 may be a single-layered structure or a multiple-layered structure. The gate electrode 110 may include a conductive metallic material such as for example platinum, gold, nickel, aluminum, molybdenum, neodymium, chromium, an alloy thereof or a combination thereof. In addition, photolithographic techniques may be used to form the pattern of the gate electrode 110. In some embodiments, the gate electrode 110 may include heavily doped p-type silicon, which is known in the art.

The gate insulating layer 120 covers the gate electrode 110. In some embodiments, a plasma-enhanced chemical vapor deposition (PECVD) process is employed to form the gate insulating layer 120. The gate insulating layer 120 may include an inorganic material such as silicon nitride ($SiN_x$), silicon oxide ($SiO_x$) and the like, or an organic polymeric material with dielectricity, such as for example polyimide.

The oxide semiconductor layer 130 is positioned on the gate insulating layer 120 and serves as an active layer of the thin film transistor 100. The gate insulating layer 120 is disposed between the gate electrode 110 and the oxide semiconductor layer 130 in order to prevent the oxide semiconductor layer 130 from contact directly with the gate electrode 110. Significantly, the oxide semiconductor layer 130 includes indium gallium zinc oxide (IGZO) represented by a general formula of $In_xGa_yZn_zO_w$, in which x, y, z and w respectively represent atomic ratios (or molar ratios) of indium (In), gallium (Ga), zinc (Zn) and oxygen (O), and x, y and z satisfy the requirements of the following formulae:

$$1.5 \leq (y/x) \leq 2 \text{ and } 1.5 \leq (y/z) \leq 2$$

In specifics, in the IGZO mentioned above, the atomic ratio or molar ratio of Ga to In (y/x) is about 1.5 to about 2. It has been discovered that the atomic ratio of Ga to In (y/x) is one of the important factors affecting the stability and reliability of the IGZO, and this feature provides a specific technical contribution. Particularly, when the atomic ratio of Ga to In (y/x) of the IGZO is less than about 1.5, the obtained thin film transistor exhibits a poor stability and reliability. For example, the threshold voltage of the thin film transistor is unstable and unreliable. In particular, when measuring the threshold voltages of an identical thin film transistor several times, the measured threshold voltages vary considerably and the variation is unacceptable. It has been discovered that when the atomic ratio of Ga to In (y/x) of the IGZO is greater than about 1.5, the threshold voltage and electrical characteristics of the thin film transistor become relatively stable and reliable. This result suggests that the chemical structure of the IGZO and/or the oxygen vacancy concentration thereof are in a stable condition when the atomic ratio of Ga to In (y/x) is greater than about 1.5. On the other hand, when the atomic ratio of Ga to In (y/x) of the IGZO is greater than about 2, the mobility of the IGZO considerably decreases, and leads to decreasing in turn-on current, and therefore degrading the overall electrical performance of the thin film transistor. Accordingly, one of the features of the present disclosure relies on the atomic ratio of Ga/In in the IGZO being about 1.5 to about 2.

In addition, the atomic ratio of Ga to Zn (y/z) is about 1.5 to about 2 in the IGZO mentioned above. The atomic ratio of Ga to Zn (y/z of the IGZO is also an important factor influencing the stability of the IGZO. When the atomic ratio of Ga to Zn (y/z) of the IGZO is less than about 1.5, the associated thin film transistor exhibits a poor stability and reliability. For example, the threshold voltage of the thin film transistor is unstable and unreliable. On the other hand, when the atomic ratio of Ga to Zn (y/z) is greater than a certain value, the mobility of the IGZO considerably decreases, and leads to decreasing in turn-on current. In another aspect, when the Zn atomic ratio (z) of the IGZO is lower than a certain value, the threshold voltage of the thin film transistor is increased, and therefore it is unfavorable to the application of the thin film transistor. It has been discovered that when the atomic ratio of Ga to Zn (y/z) of the IGZO is about 1.5 to about 2, the stability of the thin film transistor is improved, and the thin film transistor possesses satisfied mobility and suitable threshold voltage.

According to the embodiments described hereinbefore, one of the features of the present disclosure is that the atomic ratio of Ga to In (y/x) ranges from about 1.5 to about 2, and the atomic ratio of Ga to Zn (y/z) ranges from about 1.5 to about 2. When IGZO satisfies the two conditions, the reliability of the thin film transistor is improved, and the mobility thereof is greater than 10 $cm^2/Vs$. More significantly, the variation in threshold voltage is less than 1.3 V and the subthreshold swing is less than 0.6 V/dec after the thin film transistor experienced a negative bias stress test.

In some embodiments, x and z of the IGZO ($In_xGa_yZn_zO_w$) satisfy the following formula: $0.9 \leq (x/z) \leq 1.1$. Specifically, the atomic ratio or molar ratio of In to Zn ranges from about 0.9 to about 1.1. In some examples, the molar ratio of indium substantially equals the molar ratio of zinc.

In some embodiments, y and w of the IGZO ($In_xGa_yZn_zO_w$) satisfy the following formula: $0.375 \leq (y/w) \leq 0.5$. Specifically, the atomic ratio or molar ratio of gallium to oxygen ranges from about 0.375 to about 0.5. For example, the IGZO has a formula of $In_1Ga_{1.5}Zn_1O_4$, $In_1Ga_{1.6}Zn_1O_4$, $In_1Ga_{1.7}Zn_1O_4$, $In_1Ga_{1.8}Zn_1O_4$, $In_1Ga_{1.9}Zn_1O_4$, or $In_1Ga_2Zn_1O_4$.

An identical composition of IGZO may be possibly represented by a number of formulas. For example, $In_1Ga_{1.5}Zn_1O_4$ may be represented as $In_{0.133}Ga_{0.2}Zn_{0.133}O_{0.533}$, in which the sum of the atomic ratios of indium, gallium, zinc and oxygen is defined as 1, or it may also be represented as $In_{0.286}Ga_{0.429}Zn_{0.286}O_{1.143}$, in which the sum of the atomic ratios of indium, gallium and zinc is defined as 1. Accordingly, in some embodiments, when (x+y+z) is defined as 1 in the formula of "$In_xGa_yZn_zO_w$" to represent the IGZO composition, x satisfies the following formula: $0.25 \leq x \leq 0.3$; y satisfies the following formula: $0.42 \leq y \leq 0.5$; and z satisfies the following formula: $0.25 \leq z \leq 0.3$. More specifically, when the atomic ratio of the metallic elements (i.e. indium, gallium and zinc) in the IGZO is defined as 100%, the atomic ratios of indium, gallium and zinc in the metallic elements are respectively about 25% to about 30%, about 42% to about 50%, and about 25% to about 30%. In other words, the atomic ratio of indium x, the atomic ratio of gallium y, and the atomic ratio of zinc z satisfy the following formulae: $0.25 \leq x/(x+y+z) \leq 0.3$; $0.42 \leq y/(x+y+z) \leq 0.5$; and $0.25 \leq z/(x+y+z) \leq 0.3$.

In yet some embodiments, when $(x+y+z+w)$ is defined as 1 in the formula of "$In_xGa_yZn_zO_w$" to represent the IGZO composition, x satisfies the following formula: $0.125 \leq x \leq 0.134$; y satisfies the following formula: $0.2 \leq y \leq 0.25$; z satisfies the following formula: $0.125 \leq z \leq 0.13$; and w satisfies the following formula: $0.5 \leq w \leq 0.54$. In other words, in the IGZO, the atomic ratios of indium, gallium, zinc and oxygen are respectively about 12.5% to about 13.4%, about 20% to about 25%, about 12.5% to about 13.4%, and about 50% to about 34%.

According to some embodiments of the present disclosure, a target with a composition of $In_1Ga_1Zn_1O_4$, is used to form the IGZO represented by formulae of $In_1Ga_{1.5}Zn_1O_4$, $In_1Ga_{1.6}Zn_1O_4$, $In_1Ga_{1.7}Zn_1O_4$, $In_1Ga_{1.8}Zn_1O_4$, $In_1Ga_{1.9}Zn_1O_4$, or $In_1Ga_2Zn_1O_4$ through a sputtering process. In these embodiments, the power used in the sputtering process is about 3.5 kW to about 6.5 kW, the gas in the sputtering chamber is a mixture of argon (Ar) and oxygen gas ($O_2$), in which the molar ratio of oxygen gas in the mixture is about 7.5% to about 20%, and the pressure in the sputtering chamber is about 0.34 Pa to about 0.49 Pa.

Referring back to FIG. 1, the source electrode 140 and the drain electrode 150 are respectively connected to different sides of the oxide semiconductor layer 130. Techniques such as sputtering, pulsed laser deposition, electron beam physical vapor deposition, and chemical vapor deposition may be utilized to form the source electrode 140 and the drain electrode 150. The source electrode 140 and drain electrode 150 may include metallic material such as platinum, gold, nickel, aluminum, molybdenum, cupper, neodymium or a combination thereof.

In some embodiments, the thin film transistor 100 further includes a passivation layer 160, which covers the semiconductor layer 130, source electrode 140 and the drain electrode 150. The passivation layer 160 has an opening 162 exposing portions of the drain electrode 150 and/or the source electrode 140. The passivation layer 160 may be made of inorganic material such as silicon oxide, silicon nitride and the like, or organic polymeric material such as for example polyimide. In addition, the thin film transistor 100 may further include a pixel electrode 170 connected to the drain electrode 150 or the source electrode 140 through the opening 162. The pixel electrode 170 may be made of a transparent conductive material such as indium tin oxide (ITO), indium zinc oxide (IZO) and the like, or metal such as aluminum, copper, and the like.

Figure 2:
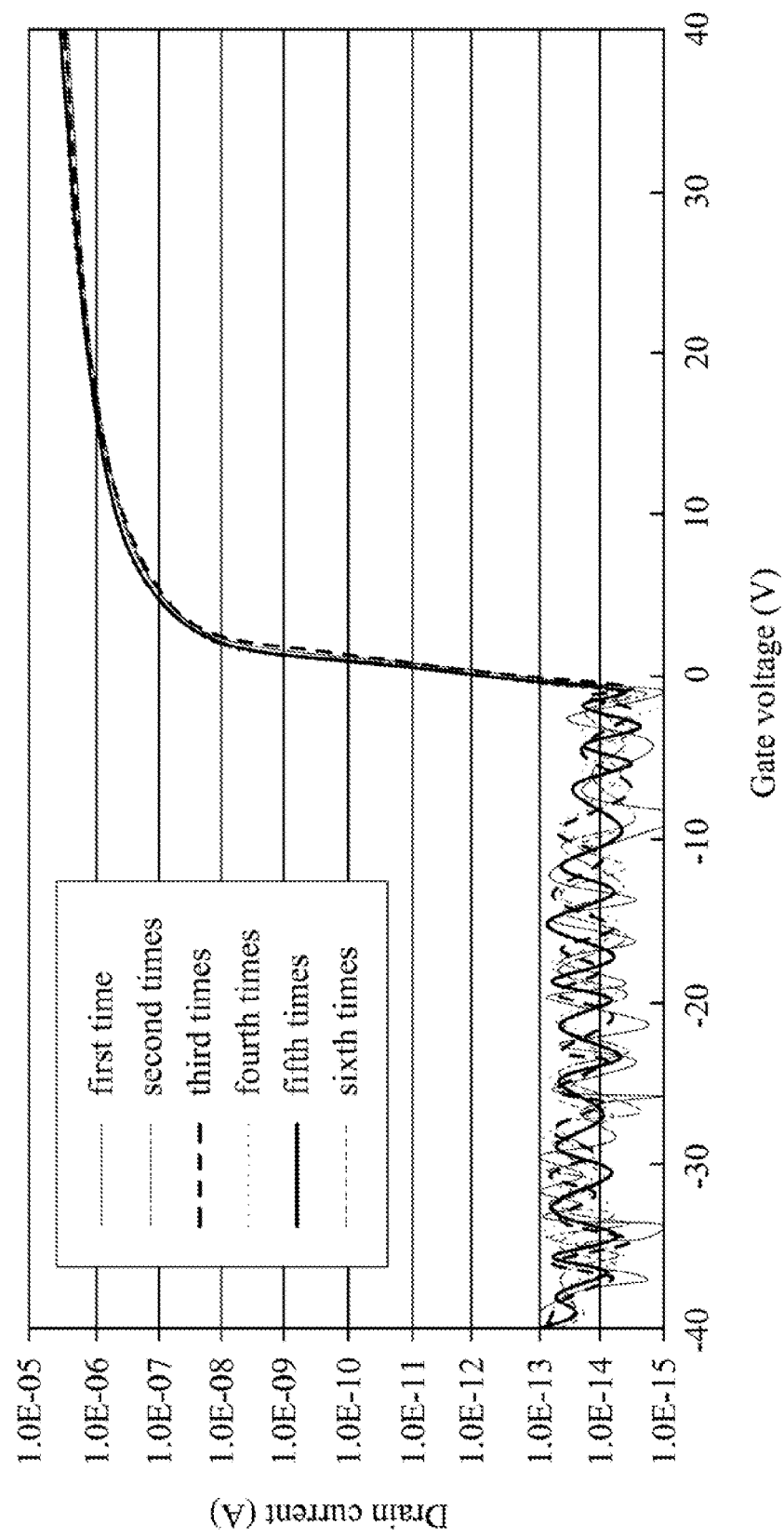
FIG. 2 is a diagram showing the relationship between the gate voltage and the drain current of a thin film transistor according to one embodiment of the present disclosure.

FIG. 2 is a diagram showing the relationship between the gate voltage and the drain current of a thin film transistor according to one embodiment of the present disclosure. In the embodiment associated with FIG. 2, the IGZO semiconductor layer in the thin film transistor has a composition of $In_1Ga_{1.6}Zn_1O_4$. FIG. 2 shows six results repeatedly measured on an identical thin film transistor. It may be found in FIG. 2 that the six results exhibit excellent repeatability, or namely reproducibility. In this embodiment, the mobility of the thin film transistor is greater than about 10 $cm^2/Vs$, the threshold voltage is less than about 1.3 V, and the subthreshold swing is less than about 0.6 NT/dec.

Figure 3:
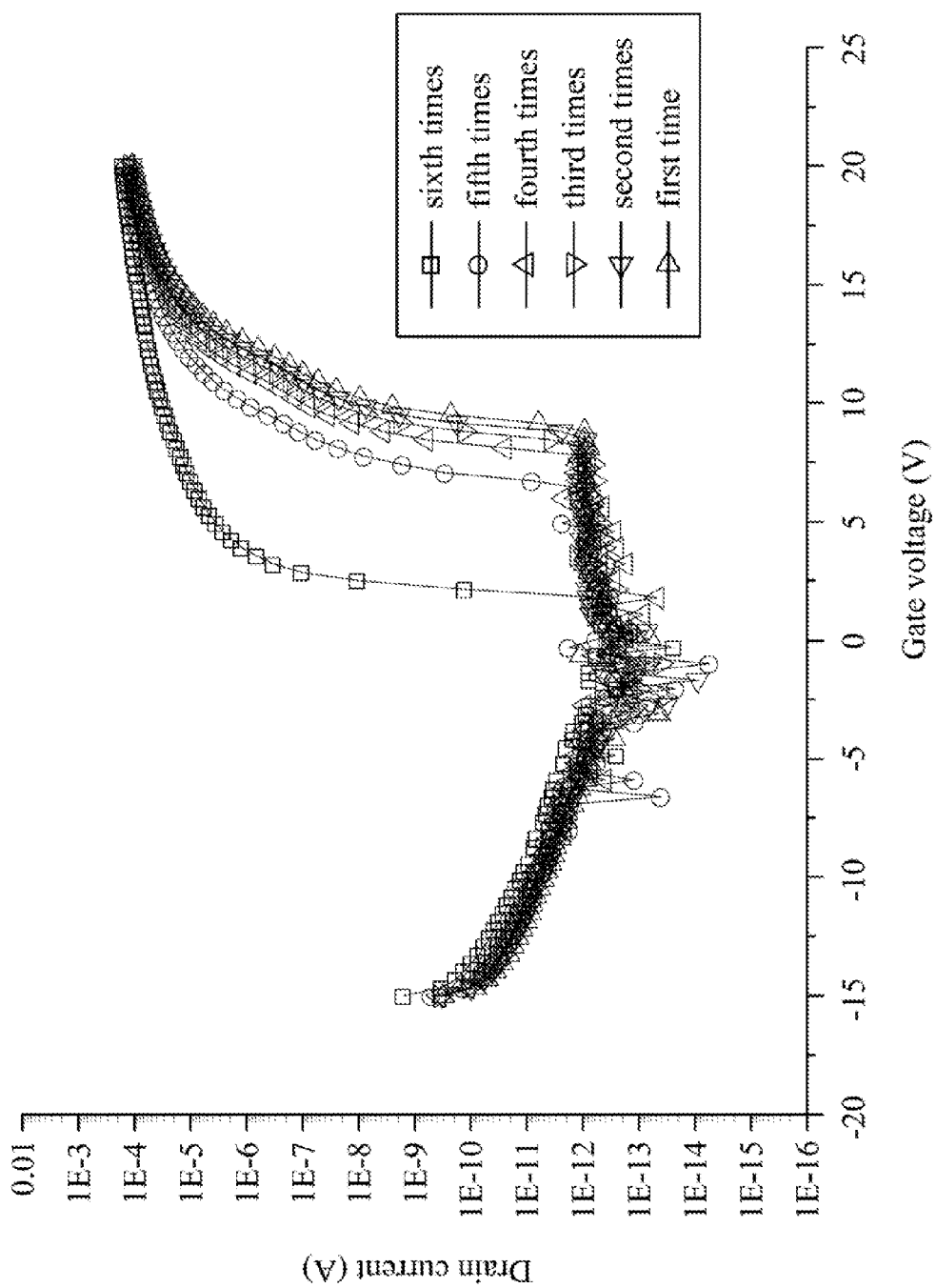
FIG. 3 is a diagram showing the relationship between the gate voltage and the drain current of a thin film transistor according to one comparative example of the present disclosure, in which the IZGO semiconductor layer has a composition of In1Ga0.8Zn1O4.

FIG. 3 is a diagram showing the relationship between the gate voltage and the drain current of a thin film transistor according to one comparative example of the present disclosure, in which the IGZO semiconductor layer has a composition of $In_1Ga_{0.8}Zn_1O_4$. FIG. 3 shows six results repeatedly measured on an identical thin film transistor. It may be found in FIG. 3 that the six measured curves differ and the threshold voltages shift considerably. As compared FIG. 2 with FIG. 3, it clearly shows that the stability and the reliability of thin film transistors can be significantly improved according to the embodiments of the present disclosure.

Figure 4:
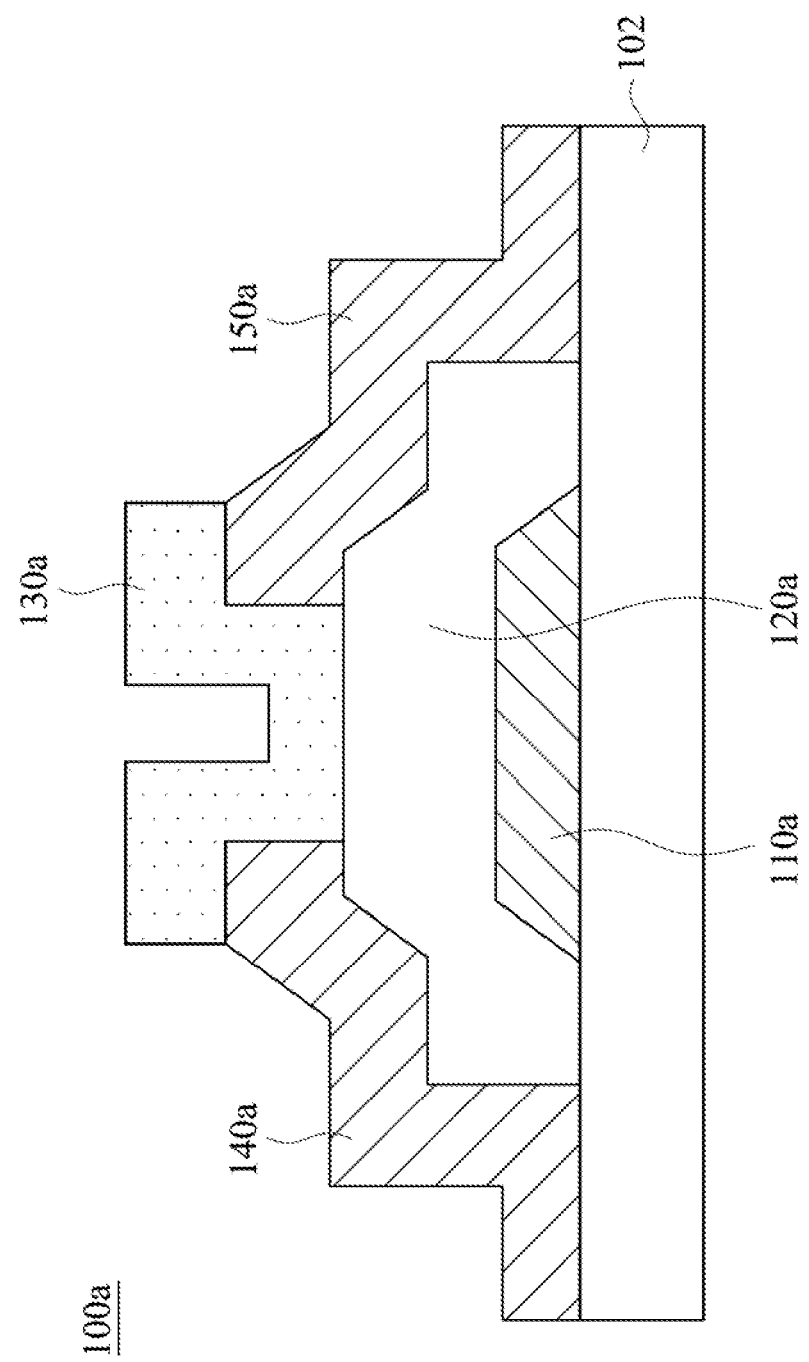
FIG. 4 is a cross-sectional view schematically showing a thin film transistor according to another embodiment of the present disclosure.

According, to various embodiments of the present disclosure, the structures of the thin film transistors are not limited to that depicted in FIG. 1. FIG. 4 is a cross-sectional view schematically showing a thin film transistor 100a according to another embodiment of the present disclosure. As shown in FIG. 4, a patterned gate insulating, layer 120a covers a gate electrode 110a, in which the gate insulating layer 120a merely covers a portion of a substrate 102. A source electrode 140a and a drain electrode 150a respectively cover on and extend from opposite sides of the gate insulating layer 120a to the substrate 102. Furthermore, opposite sides of a semiconductor layer 130a are respectively positioned on the source electrode 140a and the drain electrode 150a, The semiconductor layer 130a may have a composition described hereinbefore in connection with FIG. 1.

Figure 5:
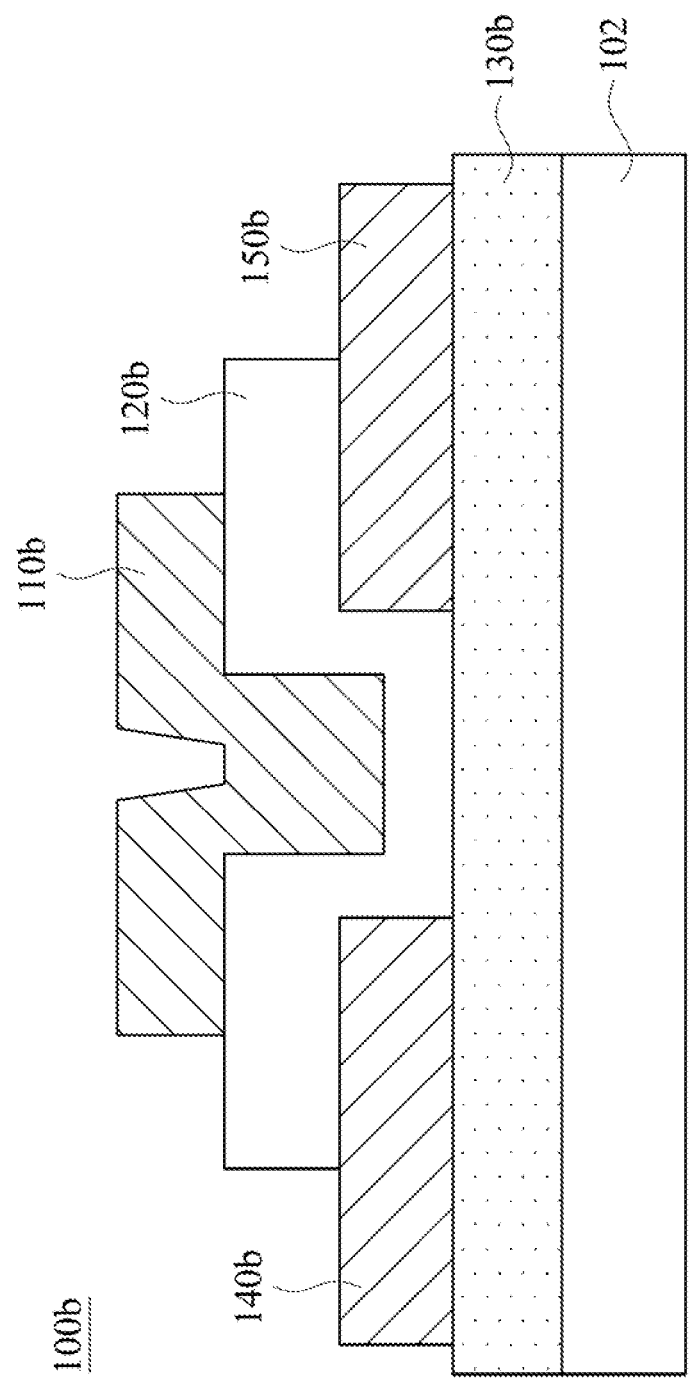
FIG. 5 is a cross-sectional view schematically showing a thin film transistor according to still another embodiment of the present disclosure.

FIG. 5 is a cross-sectional view schematically showing a thin film transistor 100b according to still another embodiment of the present disclosure. As shown in FIG. 5, a semiconductor layer 130b is formed on a substrate 102. A source electrode 140b and a drain electrode 150b are located on the semiconductor layer 130b. A gate insulating layer 120b covers portions of the source electrode 140b and the drain electrode 150b as well as a portion of the semiconductor layer 130b that is located between the source electrode 140b and the drain electrode 150b. The gate electrode 110b is disposed on the gate insulating layer 120b. The semiconductor layer 130b may have a composition described hereinbefore in connection with FIG. 1.

Figure 6:
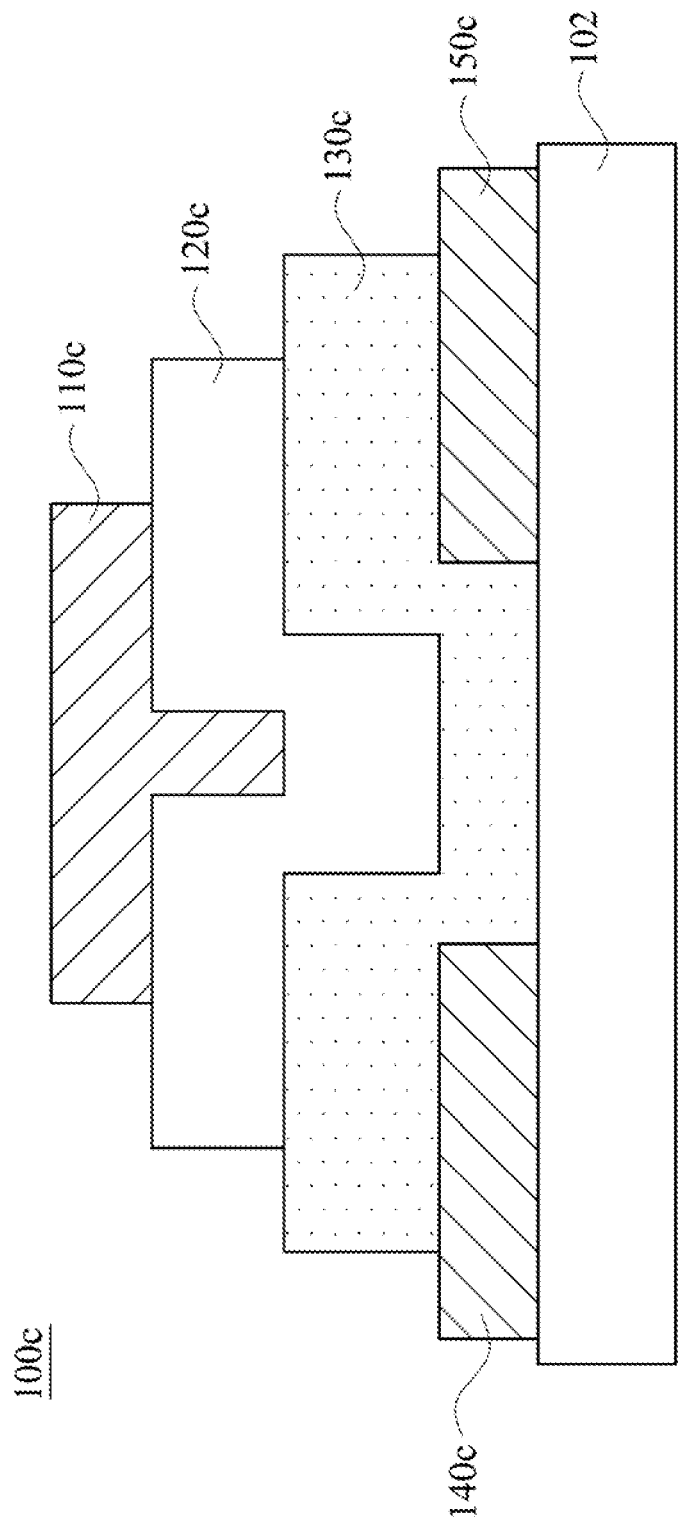
FIG. 6 is a cross-sectional view schematically illustrating a thin film transistor according to still another embodiment of the present disclosure.

FIG. 6 is a cross-sectional view schematically illustrating a thin film transistor 100c according to still another embodiment of the present disclosure. In the thin film transistor 100c, a source electrode 140c and a drain electrode 150c are formed on a substrate 102. A semiconductor layer 130c covers portions of the source electrode 140c and the drain electrode 150c as well as a portion of the substrate 102 positioned between the source electrode 140c and the drain electrode 150c. A gate insulating layer 120c is disposed on the semiconductor layer 130c, and a gate electrode 110c is disposed on the gate insulating layer 120c. The semiconductor layer 130c may have a composition described hereinbefore in connection with FIG. 1.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:
1. A thin film transistor, comprising:
an oxide semiconductor layer comprising indium gallium zinc oxide represented by a general formula of $In_xGa_yZn_zO_w$, wherein x, y, z and w respectively represent atomic ratios of indium, gallium, zinc and oxygen, and x, y and z satisfy the requirements of the following formulae: $1.5 \leq (y/x) \leq 2$ and $1.5 \leq (y/z) \leq 2$;
a gate electrode disposed beneath the oxide semiconductor layer;
a gate insulating layer positioned between the gate electrode and the oxide semiconductor layer; and a source electrode and a drain electrode disposed on the gate insulating layer and positioned at different sides of the oxide semiconductor layer, wherein each of the source electrode and the drain electrode extends from a surface of the gate insulating layer to a surface of the oxide semiconductor layer.

2. The thin film transistor according to claim 1, wherein x and z satisfy the following formula: $0.9 \leq (x/z) \leq 1.1$.

3. The thin film transistor according to claim 1, wherein y and w satisfy the following formula: $0.375 \leq (y/w) \leq 0.5$.

4. The thin film transistor according to claim 1, wherein when (x+y+z) is defined as 1, x satisfies the following formula: $0.25 \leq x \leq 0.3$.

5. The thin film transistor according to claim 1, wherein when (x+y+z) is defined as 1, y satisfies the following formula: $0.42 \leq y \leq 0.5$.

6. The thin film transistor according to claim 1, wherein when (x+y+z) is defined as 1, z satisfies the following formula: $0.25 \leq z \leq 0.3$.

7. The thin film transistor according to claim 1, wherein when (x+y+z+w) is defined as 1, x satisfies the following formula: $0.125 \leq x \leq 0.134$.

8. The thin film transistor according to claim 1, wherein when (x+y+z+w) is defined as 1, y satisfies the following formula: $0.2 \leq y \leq 0.25$.

9. The thin film transistor according to claim 1, wherein when (x+y+z+w) is defined as 1, z satisfies the following formula: $0.125 \leq z \leq 0.134$.

10. The thin film transistor according to claim 1, wherein when (x+y+z+w) is defined as 1, w satisfies the following formula: $0.5 \leq w \leq 0.54$.

11. An oxide semiconductor material comprises indium gallium zinc oxide represented by a general formula of $In_xGa_yZn_xO_w$, wherein x, y, z and w respectively represent atomic ratios of indium, gallium, zinc and oxygen, and, x, y and z satisfy the requirements of the following formulae:

$0.25 \leq x/(x+y+z) \leq 0.3$;

$0.42 \leq y/(x+y+z) \leq 0.5$; and $0.25 \leq z/(x+y+z) \leq 0.3$.

12. A thin film transistor, comprising:
a substrate;
an oxide semiconductor layer disposed on the substrate, and comprising indium gallium zinc oxide represented by a general formula of $In_xGa_yZn_zO_w$, wherein x, y, z and w respectively represent atomic ratios of indium, gallium, zinc and oxygen, and x, y and z satisfy the requirements of the following formulae: $1.5 \leq (y/x) \leq 2$ and $1.5 \leq (y/z) \leq 2$;
a gate electrode disposed above the oxide semiconductor layer;
a gate insulating layer positioned between the gate electrode and the oxide semiconductor layer; and
a source electrode and a drain electrode disposed on the oxide semiconductor layer and positioned at different sides of the gate electrode.

13. A thin film transistor, comprising:
a substrate;
an oxide semiconductor layer disposed on the substrate, and comprising indium gallium zinc oxide represented by a general formula of $In_xGa_yZn_zO_w$, wherein x, y, z and w respectively represent atomic ratios of indium, gallium, zinc and oxygen, and x, y and z satisfy the requirements of the following formulae: $1.5 \leq (y/x) \leq 2$ and $1.5 \leq (y/z) \leq 2$;
a gate electrode disposed above the oxide semiconductor layer;
a gate insulating layer positioned between the gate electrode and the oxide semiconductor layer; and
a source electrode and a drain electrode disposed on the substrate and positioned at different sides of the gate electrode, wherein each of the source electrode and the drain electrode has an end interposed between the oxide semiconductor layer and the substrate.

\* \* \* \* \*